(12) United States Patent
Kim

(10) Patent No.: US 8,000,162 B2
(45) Date of Patent: Aug. 16, 2011

(54) VOLTAGE-CONTROLLED OSCILLATOR, PHASE-LOCKED LOOP, AND MEMORY DEVICE

(75) Inventor: Chan-Kyung Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 99 days.

(21) Appl. No.: 12/614,550

(22) Filed: Nov. 9, 2009

(65) Prior Publication Data

US 2010/0124137 A1    May 20, 2010

(30) Foreign Application Priority Data

Nov. 18, 2008  (KR) .................. 10-2008-0114352

(51) Int. Cl.
*G11C 7/00*    (2006.01)
*G11C 8/00*    (2006.01)

(52) U.S. Cl. ............... 365/219; 365/233.11; 331/25; 331/48; 331/57

(58) Field of Classification Search .............. 365/219
See application file for complete search history.

(56) References Cited

U.S. PATENT DOCUMENTS 7,071,789 B2    7/2006   Gu

FOREIGN PATENT DOCUMENTS

| JP | 2007274431 A | 10/2007 |
|---|---|---|
| KR | 100728996 B1 | 6/2007 |

*Primary Examiner* — Tan T. Nguyen
(74) *Attorney, Agent, or Firm* — Volentine & Whitt, PLLC

(57) ABSTRACT

A voltage-controlled oscillator comprises a first oscillator and a second oscillator. The first oscillator may generate a plurality of intermediate clock signals at a plurality of first nodes, multiply connected to a plurality of first ring shape circuits, in response to a control voltage. The plurality of intermediate clock signals may have a different phase from each other and a same phase difference with each other. The second oscillator may generate a plurality of output clock signals at a plurality of second nodes, multiply connected to a plurality of second ring shape circuits, by changing a voltage level of the intermediate clock signals. The plurality of second ring shape circuits may pass the plurality of first nodes.

10 Claims, 13 Drawing Sheets

VOLTAGE-CONTROLLED OSCILLATOR, PHASE-LOCKED LOOP, AND MEMORY DEVICE

CROSS-REFERENCE TO RELATED APPLICATION

This application claims priority under 35 USC §119 to Korean Patent Application No. 10-2008-0114352 filed on Nov. 18, 2008, the subject matter of which is hereby incorporated by reference.

BACKGROUND

The inventive concept relates generally to circuits generating one or more clock signals, and more particularly to a voltage-controlled oscillator and a phase-locked loop having the voltage-controlled oscillator.

Voltage-controlled oscillators (VCOs) in many different forms generate an oscillating output voltage. VCOs are widely used in analog and digital circuits. In common exemplary applications, VCOs are used in phase-locked loop (PLL) circuits, clock generation circuits, and data communication devices recovering clock and data signals.

PLL circuits are widely used in memory devices to generate various clock signals. Recent design trends for contemporary memory devices have reduced the level of many operating voltages within the memory devices. At the same time, clock signals of increasing frequency are used within memory devices to provide expanded data throughput (or bandwidth). These two design objectives are at odds, since increased voltage levels have historically accompanied demands for increased operating clock frequency. Thus, contemporary design goals seek to provide clock signals having a range of operating frequencies at relatively low operating voltages. Frequency, signal timing, and phase coherency requirements (e.g., same frequency and/or same phase) are also important in the generation of clock signals within memory devices and in the management of various internal and external clock signals.

SUMMARY

Embodiments of the inventive concept provide a voltage-controlled oscillator (VCO) generating clock signals having a desired frequency at a low operating voltage. Embodiments of the inventive concept also provide a phase-locked loop (PLL) incorporating such a VCO, and memory devices incorporating such a PLL.

In certain embodiments, the inventive concept provides a voltage-controlled oscillator (VCO), comprising; a first oscillation unit configured to generate a plurality of respective intermediate clock signals at a plurality of first respective nodes to which a plurality of first ring-shaped circuits are multiply connected in response to a control voltage, wherein each one of the plurality of intermediate clock signals has a different phase, a defined relative phase difference with other ones of the plurality of intermediate clock signals, and swings between a first voltage level and a second voltage level, and a second oscillation unit configured to convert voltage levels of the plurality of intermediate clock signals to generate a plurality of respective output clock signals at a plurality of second respective nodes to which a plurality of second ring-shaped circuits are multiply connected, the plurality of second ring-shaped circuits passing the plurality of first nodes, and the plurality of output clock signals swinging between a third voltage level and a fourth voltage level.

In certain embodiments, the inventive concept provides a phase-locked loop (PLL), comprising; a phase difference detector configured to generate an up signal and a down signal based on a phase difference between an input clock signal and a feedback clock signal, a charge pump configured to increase a control voltage in response to the up signal, and to decrease the control voltage in response to the down signal, and a voltage-controlled oscillator (VCO) configured to generate a plurality of internal clock signals in response to the control voltage, wherein each one of the plurality of internal clock signals has a different phase, a defined relative phase difference with other ones of the plurality of internal clock signals, and a full voltage swing between a first voltage level and a second voltage level.

In certain embodiments, the inventive concept provides a memory device, comprising; a memory cell array, a phase-locked loop (PLL) configured to generate a plurality of internal clock signals in response to an input clock signal and a feedback clock signal, wherein each one of the plurality of internal clock signals has a different phase, a defined relative phase difference with other ones of the plurality of internal clock signals, and a full voltage swing between a first voltage level and a second voltage level, a control signal generator configured to generate a plurality of control signals based on the plurality of internal clock signals, at least one deserializer configured to convert a serial bit stream into a parallel bit stream in response to each of the plurality of control signals, the parallel bit stream being written into the memory cell array, and at least one serializer configured to convert a parallel bit stream received from the memory cell array into a serial bit stream in response to each of the plurality of control signals.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Various example embodiments will now be described more fully with reference to the accompanying drawings. The present inventive concept may, however, be embodied in many different forms and should not be construed as being limited to only the illustrated embodiments. Rather, these embodiments are provided so that this disclosure will be thorough and complete, and will fully convey the scope of the present invention to those skilled in the art. Throughout the written description and drawings, like reference numbers and labels are used to denote like or similar elements.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1A:
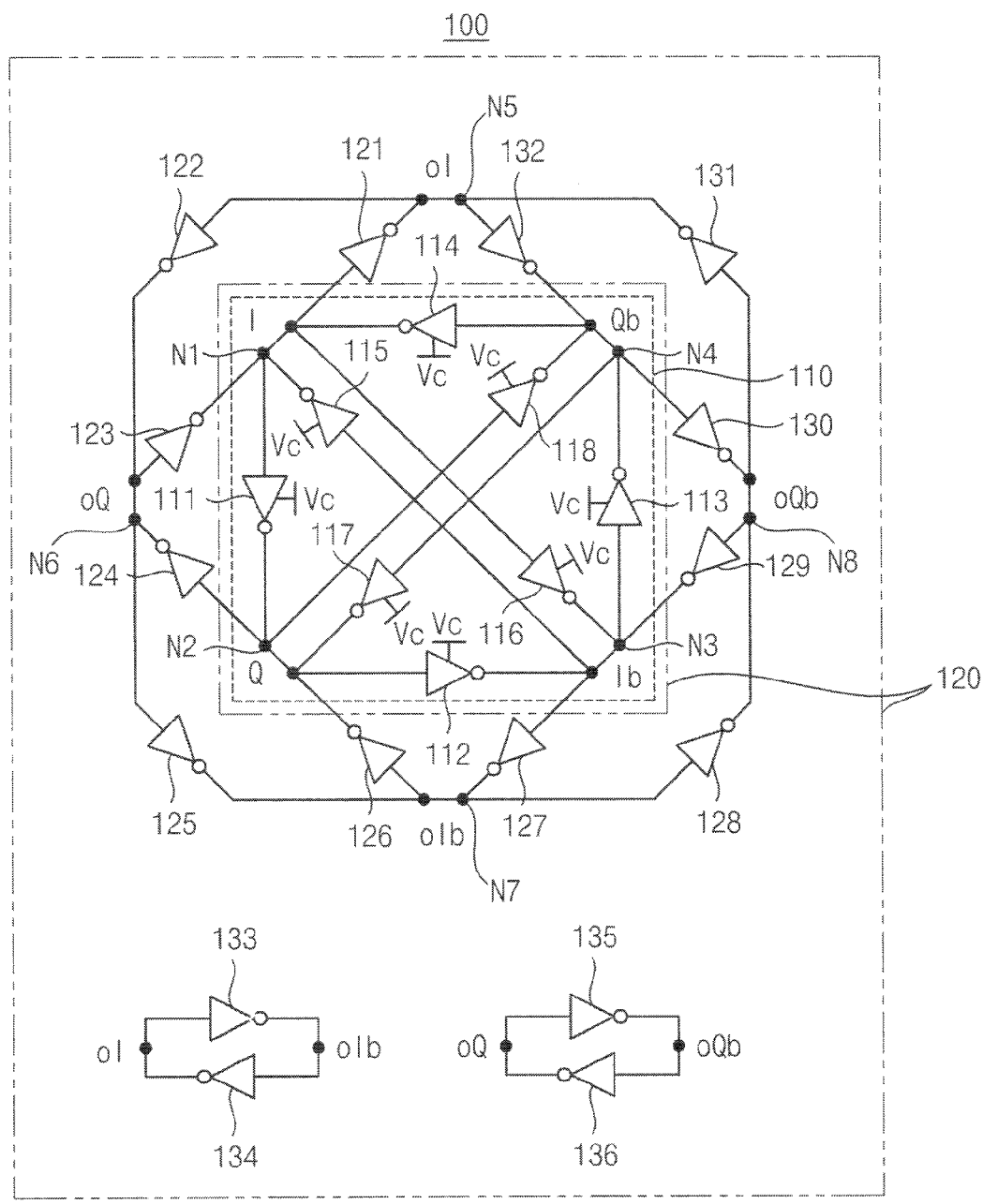
FIG. 1A is a circuit diagram illustrating a voltage-controlled oscillator according to an embodiment of the inventive concept.
Figure 1A:
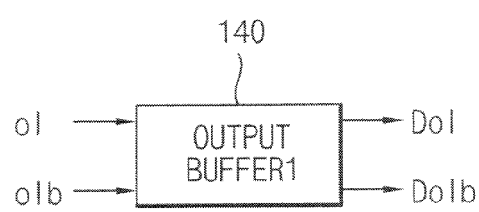
Figure 1A:
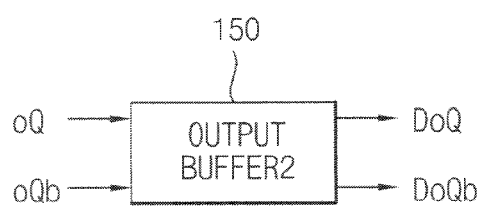

FIG. 1A is a circuit diagram illustrating a voltage-controlled oscillator (VCO) according to an embodiment of the inventive concept. Referring to FIG. 1A, a VCO 100 generally comprises a first oscillation unit 110 and a second oscillation unit 120. The VCO 100 may further comprise in various embodiments a first output buffer 140 and a second output buffer 150.

In the illustrated example, the first oscillation unit 110 includes eight (8) first inversion circuits, (i.e., eight (8) first inverters 111 to 118). A ring-shaped circuit including three inverters 111, 112 and 115, another ring-shaped circuit including three inverters 113, 114 and 116, and even another ring-shaped circuit including three inverters 111, 118 and 114 may share a node N1 of the first oscillation unit 110. A ring-shaped circuit including three inverters 112, 113 and 117, another ring-shaped circuit including three inverters 111, 118 and 114, and even another ring-shaped circuit including three inverters 111, 112 and 115 may share a node N2 of the first oscillation unit 110. A ring-shaped circuit including three inverters 113, 114 and 116, another ring-shaped circuit including three inverters 115, 111 and 112, and even another ring-shaped circuit including three inverters 113, 117 and 112 may share a node N3 of the first oscillation unit 110. A ring-shaped circuit including three inverters 114, 111 and 118, another ring-shaped circuit including three inverters 113, 117 and 112, and even another ring-shaped circuit including three inverters 113, 114 and 116 may share a node N4 of the first oscillation unit 110. That is, each of the nodes N1, N2, N3 and N4 of the first oscillation unit 110 may be multiply coupled to first ring-shaped circuits, each of which includes at least three inverters among the first inverters 111 to 118.

Figure 1B:
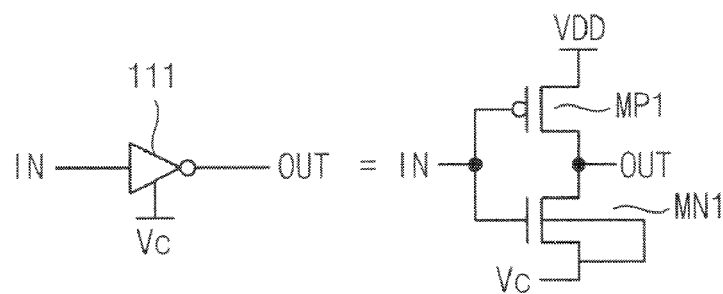
FIG. 1B is a circuit diagram illustrating an inverter among first inverters included in a first oscillator.

FIG. 1B is a circuit diagram further illustrating inverter 111 among the first inverters 111 to 118 included in the first oscillation unit 110 of FIG. 1A. Referring to FIG. 1B, the inverter 111 is a P-type metal oxide semiconductor (PMOS) transistor MP1 and an N-type metal oxide semiconductor (NMOS) transistor MN1 connected in series between a power supply voltage VDD and a control voltage Vc. The PMOS transistor MP1 and the NMOS transistor MN1 may be coupled in series with each other. The control voltage Vc may be applied to a source and a body of the NMOS transistor MN1. That is, the inverter 111 may generate an output signal OUT swinging between the power supply voltage VDD and the control voltage Vc by inverting an input signal IN. Other inverters 112 to 118 may have the same structure as the inverter 111.

Referring again to FIG. 1A, the second oscillation unit 120 in the illustrated example comprises sixteen (16) second inversion circuits, (i.e., sixteen (16) second inverters 121 to 136). A ring-shaped circuit including three inverters 121, 122 and 123 may pass the node N1. A ring-shaped circuit including three inverters 124, 125 and 126 may pass the node N2. A ring-shaped circuit including three inverters 127, 128 and 129 may pass the node N3. A ring-shaped circuit including three inverters 130, 131 and 132 may pass the node N4.

The ring-shaped circuit including three inverters 130, 131 and 132 and the ring-shaped circuit including three inverters 121, 122 and 123 may be connected at a node N5 of the second oscillation unit 120. The ring-shaped circuit including three inverters 121, 122 and 123 and the ring-shaped circuit including three inverters 124, 125 and 126 may be connected at a node N6 of the second oscillation unit 120. The ring-shaped circuit including three inverters 124, 125 and 126 and the ring-shaped circuit including three inverters 127, 128 and 129 may be connected at a node N7 of the second oscillation unit 120. The ring-shaped circuit including three inverters 127, 128 and 129 and the ring-shaped circuit including three inverters 130, 131 and 132 may be connected at a node N8 of the second oscillation unit 120. A first latch circuit including inverters 133 and 134 may be coupled between the node N5 and the node N7. That is, an input terminal of an inverter 133 may be connected to the node N5 and an output terminal of the inverter 133 may be connected to the node N7, and an input terminal of an inverter 134 may be connected to the node N7 and an output terminal of the inverter 134 may be connected to the node N5. A second latch circuit including inverters 135 and 136 may be coupled between the node N6 and the node N8. That is, an input terminal of an inverter 135 may be connected to the node N6 and an output terminal of the inverter 135 may be connected to the node N8, and an input terminal of an inverter 136 may be connected to the node N8 and an output terminal of the inverter 136 may be connected to the node N6.

Figure 1C:
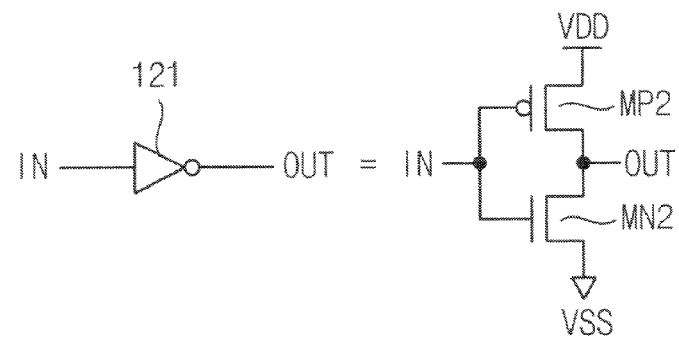
FIG. 1C is a circuit diagram illustrating an inverter among second inverters included in a second oscillator.

FIG. 1C is a circuit diagram further illustrating inverter 121 among the second inverters 121 to 136 included within the second oscillation unit 120 of FIG. 1A. Referring to FIG. 1C, the inverter 121 includes a PMOS transistor MP2 and an NMOS transistor MN2 connected in series between the power supply voltage VDD and a ground voltage VSS. The PMOS transistor MP2 and the NMOS transistor MN2 may be coupled in series with each other. The inverter 121 may generate an output signal OUT swinging between the power supply voltage VDD and the ground voltage VSS by inverting an input signal IN. Other inverters 122 to 136 may have the same structure as the inverter 121.

An exemplary mode of operation for the VCO 100 will now be described. Intermediate clock signals I, Q, Ib and Qb generated respectively at first nodes N1, N2, N3 and N4 of the first oscillation unit 110 will first be described. Then output clock signals oI, oQ, oIb and oQb generated respectively at second nodes N5, N6, N7 and N8 of the second oscillation unit 120 will be described.

In the illustrated example, the intermediate clock signal I is generated at the node N1 by performing a phase interpolation on clock signals provided from inverters 114 and 115 of the first oscillation unit 110. The intermediate clock signal Q may be generated at the node N2 by performing a phase interpolation on clock signals provided from inverters 111 and 117 of the first oscillation unit 110. The intermediate clock signal Ib may be generated at the node N3 by performing a phase interpolation on clock signals provided from inverters 112 and 116 of the first oscillation unit 110. The intermediate clock signal Qb may be generated at the node N4 by performing a phase interpolation on clock signals provided from inverters 113 and 118 of the first oscillation unit 110. That is, the intermediate clock signals I, Q, Ib and Qb may be generated respectively at the first nodes N1, N2, N3 and N4 of the first oscillation unit 110 by performing a phase interpolation on clock signals provided from at least two inverters. The intermediate clock signals I, Q, Ib and Qb may have a same frequency and a same phase difference with each other. In this example embodiment, the clock signal Q may have a phase difference of 90° from the clock signal I, the clock signal Ib may have a phase difference of 180° from the clock signal I, and the clock signal Qb may have a phase difference of 270° from the clock signal I.

As described above with reference to FIG. 1B, the intermediate clock signals I, Q, Ib and Qb may swing between the power supply voltage VDD and the control voltage Vc. The first oscillation unit 110 may generate the intermediate clock signals I, Q, Ib and Qb, having the same frequency, respectively, at the first nodes N1, N2, N3 and N4 to which the first ring-shaped circuits are multiply coupled in response to the control voltage Vc. That is, the first oscillation unit 110 may generate an "in-phase" clock signal I and a quadrature-phase clock signal Q, and an inverted version Ib of the in-phase clock signal I and an inverted version Qb of the quadrature-phase clock signal Q.

An output clock signal oI, having an increased voltage level by inverters 121 and 131, may be generated at the node N5 of the second oscillation unit 120. An output clock signal oQ, which has an increased voltage level by inverters 122 and 124, may be generated at the node N6 of the second oscillation unit 120. An output clock signal oIb, which has an increased voltage level by inverters 125 and 127, may be generated at the node N7 of the second oscillation unit 120. An output clock signal oQb, which has an increased voltage level by inverters 128 and 130, may be generated at the node N8 of the second oscillation unit 120. The second oscillation unit 120 may include ring-shaped circuits passing the first nodes N1, N2, N3 and N4, the first latch circuit and the second latch circuit.

As described above with reference to FIG. 1C, each of the second inverters 121 to 136 included in the second oscillation unit 120 may be coupled between the power supply voltage VDD and the ground voltage VSS. Therefore, the output clock signals oI, oQ, oIb and oQb generated respectively at the second nodes N5, N6, N7 and N8 of the second oscillation unit 120 will have an ordered phase difference of 90°, and the voltage level of the output clock signals oI, oQ, oIb and oQb will be higher than the voltage level of the intermediate clock signals I, Q, Ib and Qb.

The first output buffer 140 may generate corrected clock signals DoI and DoIb by correcting duty cycles of the output clock signals oI and oIb forming a differential pair. The second output buffer 150 may generate corrected clock signals DoQ and DoQb by correcting duty cycles of the output clock signals oQ and oQb forming a differential pair. The composition and operation of the output buffers 140 and 150 will be described later.

Figure 2:
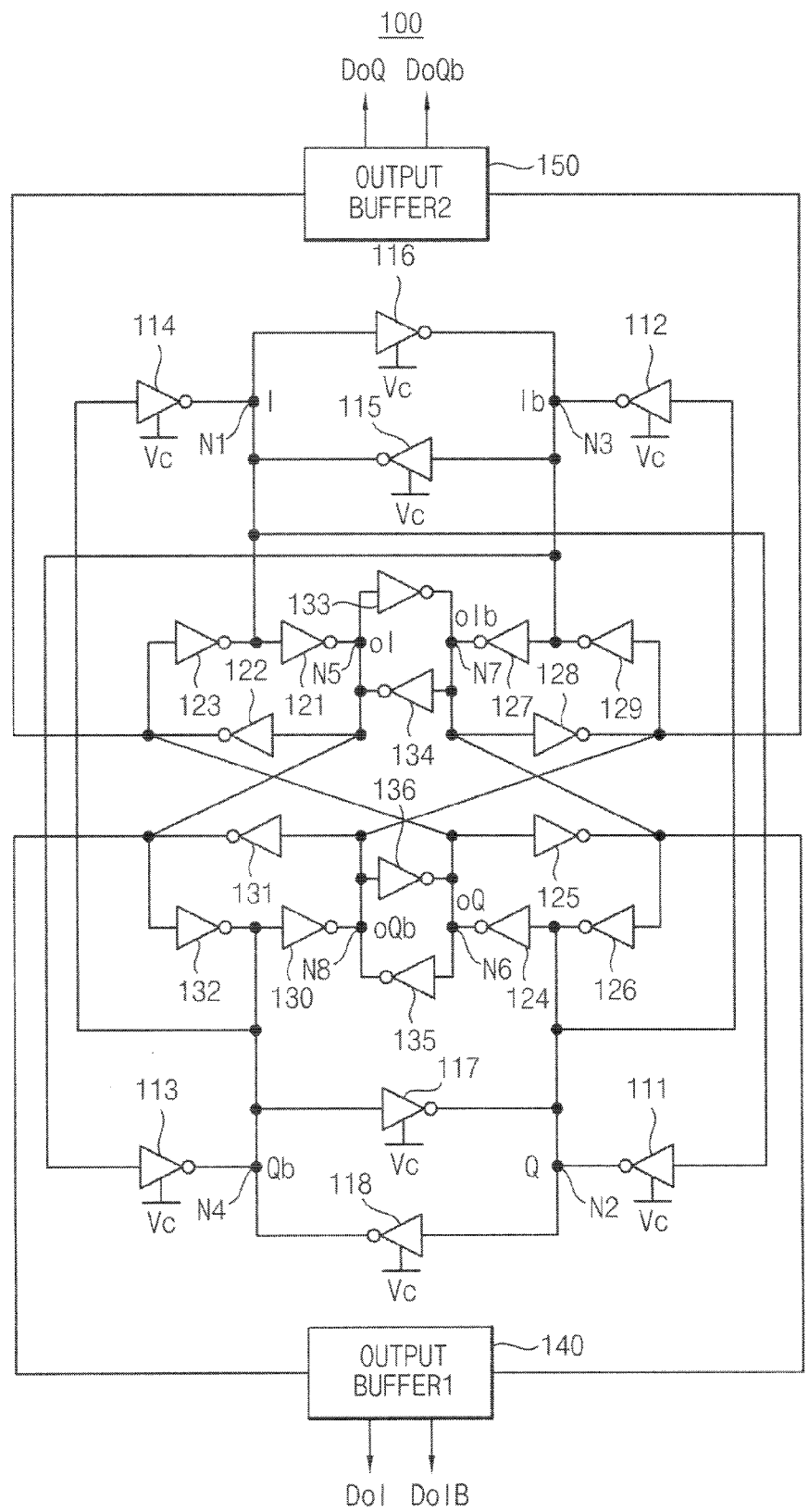
FIG. 2 is an equivalent circuit diagram of the voltage-controlled oscillator of FIG. 1A.

FIG. 2 is an equivalent circuit diagram further illustrating the VCO 100 of FIG. 1A in a different view. In FIG. 2, the first output buffer 140 and the second output buffer 150 are connected to the first oscillation unit 110 and the second oscillation unit 120 of FIG. 1A. In FIG. 2, the first oscillation unit 110 and the second oscillation unit 120 of FIG. 1A are not illustrated separately.

Referring to FIG. 2, a loop passing the node N1, at which the intermediate clock signal I is generated, may be formed by the ring-shaped circuit including the first inverters 116, 113 and 114. A loop passing the node N2, at which the intermediate clock signal Q is generated, may be formed by the ring-shaped circuit including the first inverters 118, 114 and 111. A loop passing the node N3, at which the intermediate clock signal Ib is generated, may be formed by the ring-shaped circuit including the first inverters 115, 111 and 112. A loop passing the node N4, at which the intermediate clock signal Qb is generated, may be formed by the ring-shaped circuit including the first inverters 117, 112 and 113. A loop passing the node N5, at which the output clock signal oI is generated, may be formed by the ring-shaped circuit including the second inverters 133, 126, 124, 123 and 121.

Figure 3:
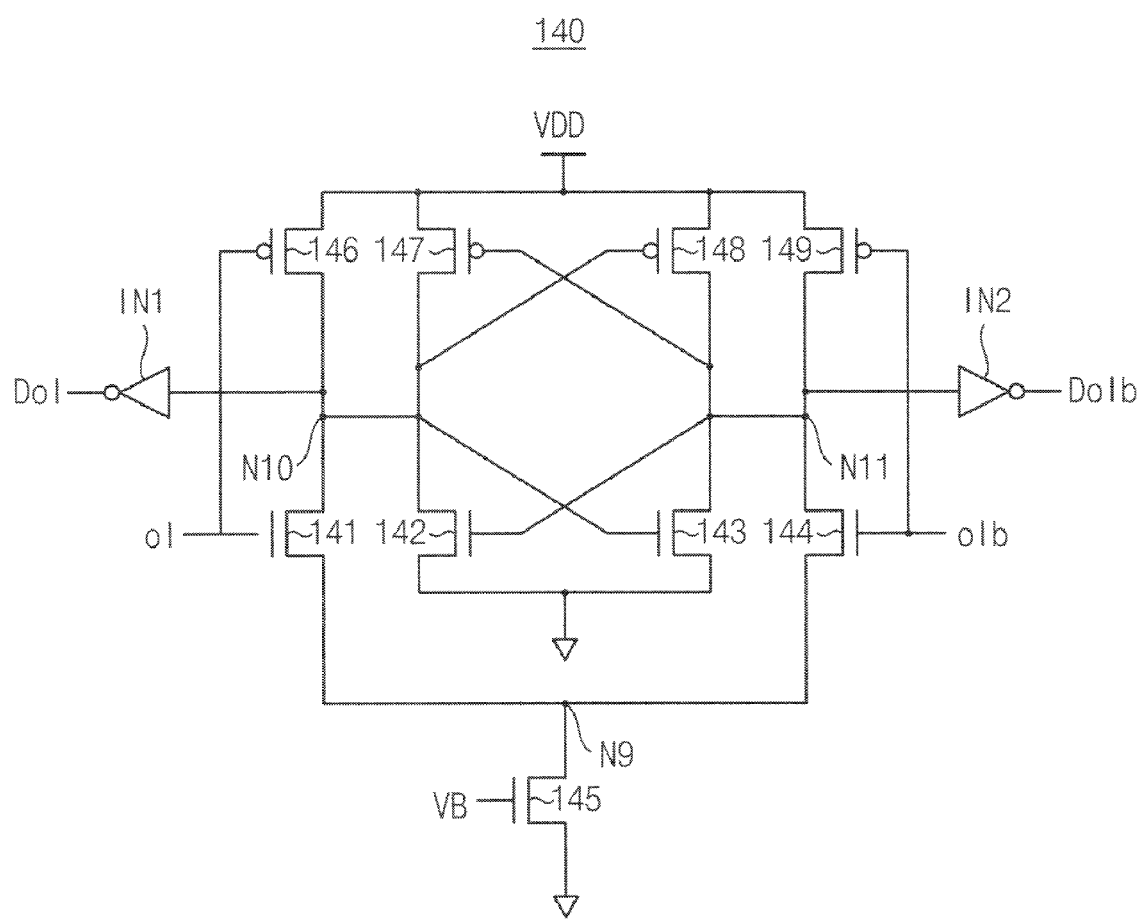
FIG. 3 is a circuit diagram further illustrating a first output buffer among output buffers of FIG. 1A and FIG. 2.

FIG. 3 is a circuit diagram further illustrating the first output buffer 140 among the output buffers 140 and 150 of FIG. 1A and FIG. 2. Referring to FIG. 3, the first output buffer 140 may include NMOS transistors 141 to 145, PMOS transistors 146 to 149 and inverters IN1 and IN2. A PMOS transistor 146 and an NMOS transistor 141 may constitute an inverter coupled between the power supply voltage VDD and a node N9, and a PMOS transistor 149 and an NMOS transistor 144 may constitute an inverter coupled between the power supply voltage VDD and a node N9. An NMOS transistor 145, which is controlled by a bias voltage VB and operates as a current source, may be coupled to the node N9. PMOS transistors 147 and 148 may be coupled in a latch structure between the power supply voltage VDD and nodes N10 and N11, and NMOS transistors 142 and 143 may be coupled in a latch structure between the nodes N10 and N11 and the ground voltage.

Each of the output clock signals oI and oIb forming a differential pair may be applied to the inverter, including the PMOS transistor 146 and the NMOS transistor 141, and the inverter, including the PMOS transistor 149 and the NMOS transistor 144, respectively. A voltage level of the node N9 may be controlled by the bias voltage VB, and the output clock signals oI and oIb may be inverted with swinging between the power supply voltage VDD and the voltage level of the node N9. The inverted signals may be latched by the PMOS transistors 147 and 148 and the NMOS transistors 142 and 143 so that duty cycles of the inverted signals are corrected. The duty cycles-corrected signals may be provided as the corrected clock signals DoI and DoIb through the inverters IN1 and IN2, respectively. That is, the output buffer 140 of FIG. 3 may correct the duty cycles of the output clock signals oI and oIb by controlling a swing width of the output clock signals oI and oIb with the NMOS transistor 145 and latching the inverted signals with the PMOS transistors 147 and 148 and the NMOS transistors 142 and 143.

A description of the second output buffer 150 will be omitted since the structure of the second output buffer 150 may essentially be the same as that of the first output buffer 140.

Figure 4A:
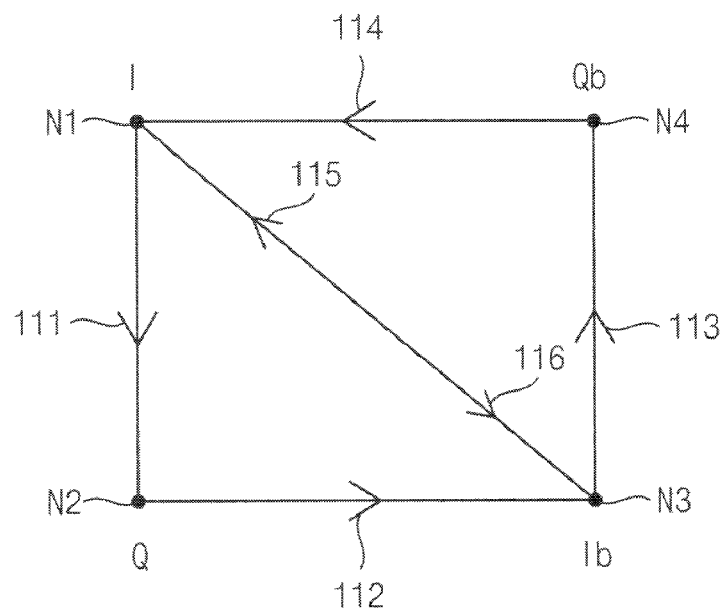
FIG. 4A to FIG. 4C are diagrams illustrating certain node relationships in FIG. 1A, as coupled within a plurality of ring shape circuits.
Figure 4B:
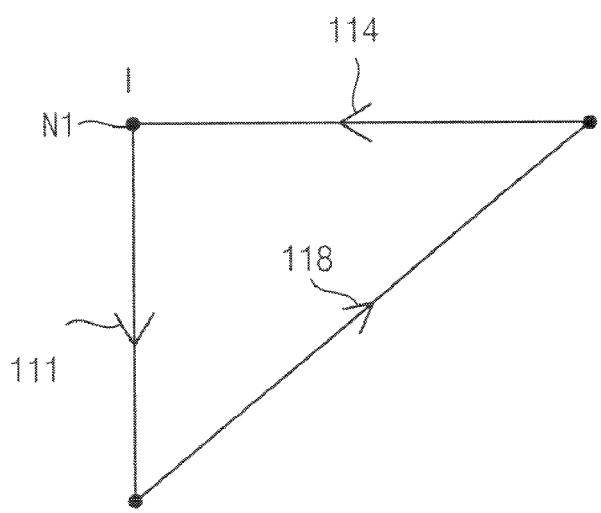
Figure 4C:
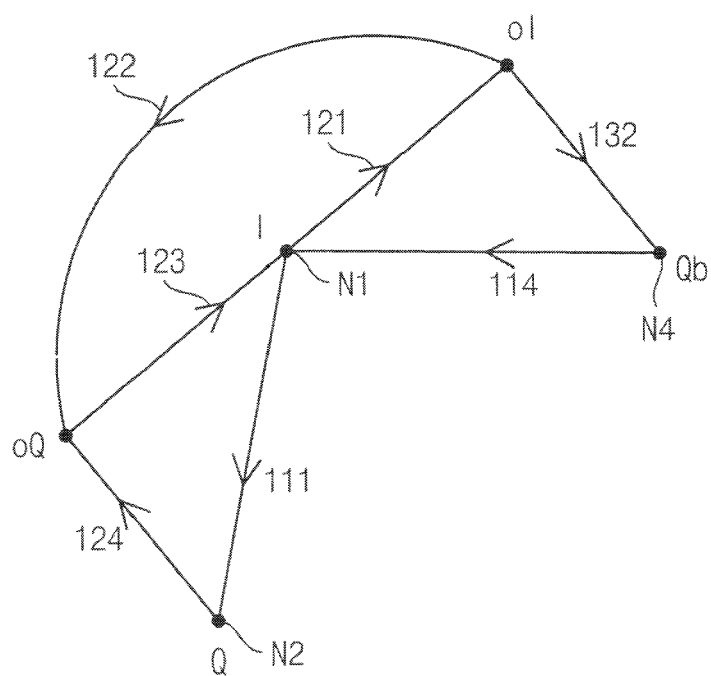

FIG. 4A to FIG. 4C are diagrams illustrating node relationships within the embodiment of FIG. 1A including common coupling between a plurality of ring-shaped circuits. The arrows used in FIG. 4A to FIG. 4C represent the inverters of FIG. 1A and are used in this manner for convenience of description.

Referring to FIG. 4A to FIG. 4C, the node N1, at which the intermediate clock signal I is generated, is "multiply coupled" between at least six (6) ring-shaped circuits. The intermediate clock signals I, Q, Ib and Qb generated at the first nodes N1, N2, N3 and N4 maintain a constant oscillation characteristic and phase difference relationship with respect to each other, since each of the first nodes N1, N2, N3 and N4 is multiply coupled to a plurality of ring-shaped circuits.

Figure 5A:
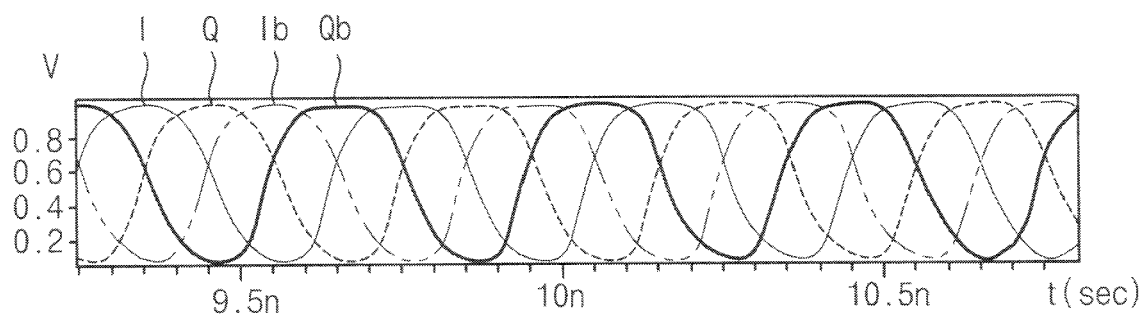
FIG. 5A to FIG. 5C are simulation diagrams illustrating a plurality of signals generated from a first oscillator, a second oscillator and the output buffers.
Figure 5B:
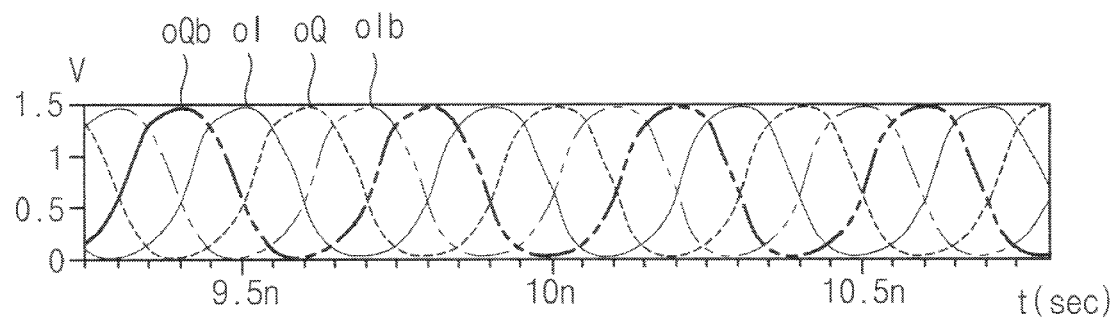
Figure 5C:
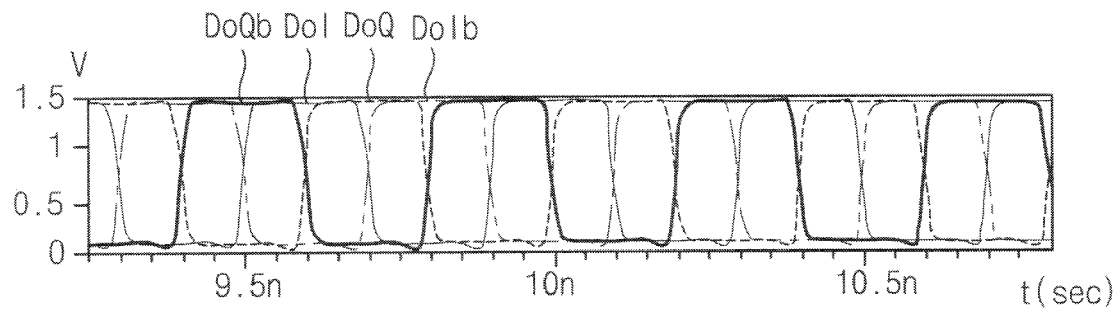

FIG. 5A to FIG. 5C are simulation diagrams illustrating a plurality of signals generated by the first oscillation unit 110, second oscillation unit 120 and output buffers 140 and 150.

Referring to FIG. 5A, the intermediate clock signals I, Q, Ib and Qb respectively generated at the first nodes N1, N2, N3 and N4 may swing between about 0V and about 0.9V in response to the control voltage Vc which is applied to the source and the body of the NMOS transistor MN1 of the first inverters 111 to 118.

Referring to FIG. 5B, the output clock signals oI, oQ, oIb and oQb generated respectively at the second nodes N5, N6, N7 and N8 may swing between about 0V and about 1.5V by the second inverters 121 to 132. The duty cycles for the output clock signals oI, oQ, oIb and oQb are not the same.

Referring to FIG. 5C, the corrected clock signals DoI, DoQ, DoIb and DoQb generated from the output buffers 140 and 150 may swing between about 0V and about 1.5V, and duty cycles for the corrected clock signals DoI, DoQ, DoIb and DoQb are substantially the same.

Figure 6A:
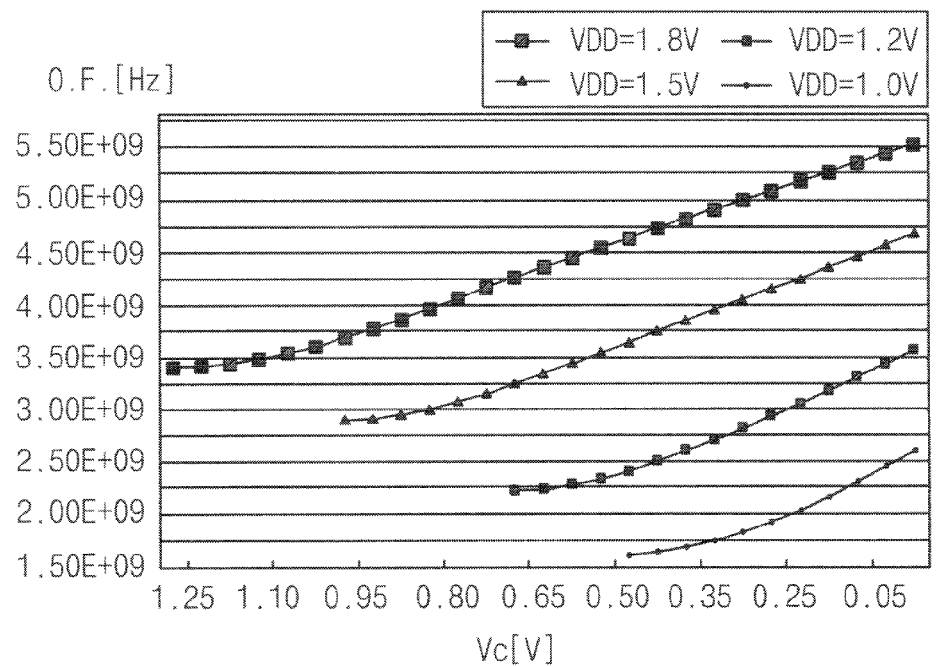
FIG. 6A to FIG. 6C are simulation diagrams illustrating characteristics of clock signals generated by the voltage-controlled oscillator of FIG. 1A and FIG. 2 in response to a control voltage.
Figure 6B:
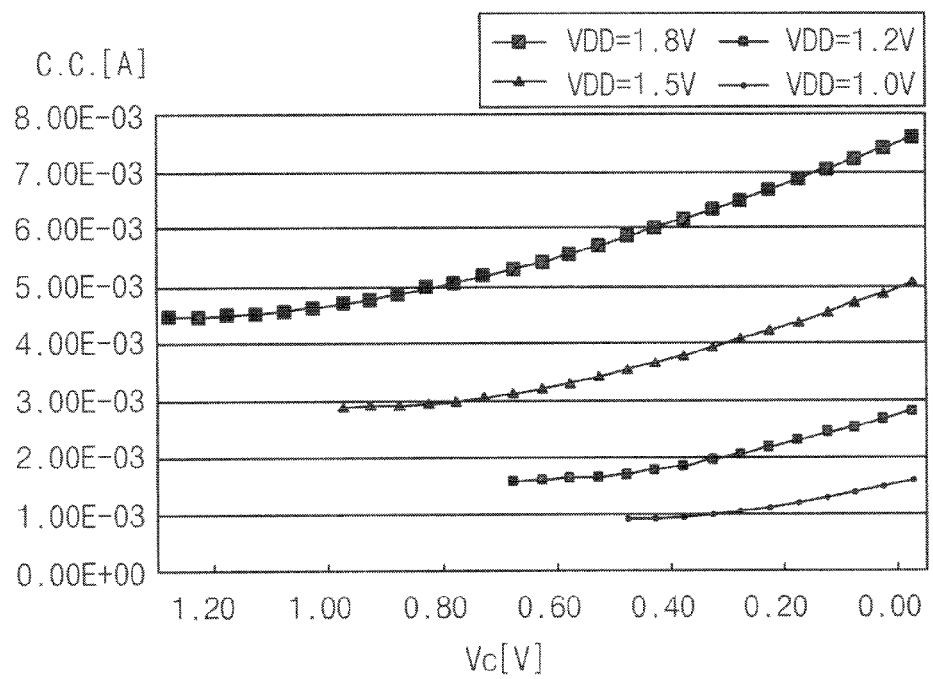
Figure 6C:
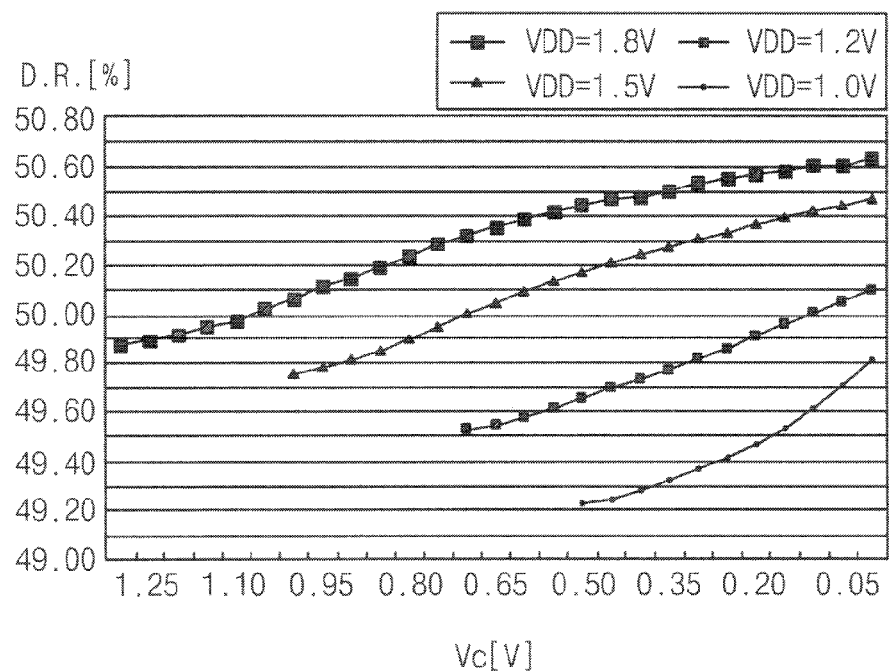

FIG. 6A to FIG. 6C are simulation diagrams further illustrating characteristics of the clock signals generated by the voltage-controlled oscillator 100 of FIG. 1A and FIG. 2 in response to the control voltage Vc. The clock signals described with reference to the FIG. 6A to FIG. 6C may be the intermediate clock signals I, Q, Ib and Qb, the output clock signals oI, oQ, oIb and oQb, or the corrected clock signals DoI, DoQ, DoIb and DoQb. The following is a description when the clock signals are the corrected clock signals DoI, DoQ, DoIb and DoQb.

FIG. 6A illustrates an oscillation frequency of the corrected clock signals DoI, DoQ, DoIb and DoQb in response to the control voltage Vc.

Referring to FIG. 6A, the oscillation frequency of the corrected clock signals DoI, DoQ, DoIb and DoQb may be decreased when the control voltage Vc is increased. Also, the power supply voltage VDD may be increased to generate the clock signals having a high oscillation frequency.

FIG. 6B illustrates a current consumption of the VCO 100 in response to the control voltage Vc.

Referring to FIG. 6B, the current consumption of the VCO 100 may be decreased when the control voltage Vc is increased.

FIG. 6C illustrates a duty cycle ratio of the corrected clock signals DoI, DoQ, DoIb and DoQb in response to the control voltage Vc.

Referring to FIG. 6C, the duty cycle ratio of the corrected clock signals DoI, DoQ, DoIb and DoQb is decreased when the control voltage Vc is increased. In general, it is preferred that a duty cycle ratio of a clock signal stays at about 50%. In the illustrated example, the duty cycle ratio of the corrected clock signals DoI, DoQ, DoIb and DoQb will vary within 10% of 50% when the power supply voltage VDD is about 1.2V and about 1.5V.

As described above with reference to FIG. 6A to FIG. 6C, when a VCO according to an embodiment of the inventive concept is not used, (e.g.,) at first, clock signals having an oscillation frequency of 4 GHz should be generated, and then clock signals having an oscillation frequency of 2 GHz may be generated by dividing the clock signals of 4 GHz using a divider. Therefore, as illustrated in FIG. 6A, the power supply voltage should be high in order to generate the clock signals having an oscillation frequency of 4 GHz. As illustrated in FIG. 6B, the current consumption increases as the power supply voltage increases, and as illustrated in FIG. 6C, the duty cycle ratio becomes more different from 50% as the power supply voltage increases. Also, a separate inverter should be needed to increase a voltage level of the clock signals.

With reference to FIG. 1A to FIG. 6C, it is described that the VCO 100 may generate the four output clock signals oI, oQ, oIb and oQb having an increasing voltage level, the same frequency and the same relative phase difference of 90° between each other. However, the scope of the inventive concept is not limited to generating only four clock signals having a phase difference of 90°, as will be appreciated by those skilled in the art. Rather, embodiments of the inventive concept may be used to generate clock signals having various phase differences by changing the number of the inverters included in the first oscillation unit 110 and the second oscillation unit 120. For example, according certain embodiments, a VCO may generate six (6) clock signals having a phase difference of 60° by including the first oscillation unit 110 illustrated in FIG. 4A in a hexagon shape instead of a rectangular shape, and including the second oscillation unit 120 in accordance with the first oscillation unit 110. Alternately, a VCO may generate eight (8) clock signals having a phase difference of 45° by including the first oscillation unit 110 in an octagon shape and including the second oscillation unit 120 in accordance with the first oscillation unit 110. Also, eight (8) clock signals may be generated by connecting a divider having a division ratio of two to each of the output buffers 140 and 150.

Figure 7:
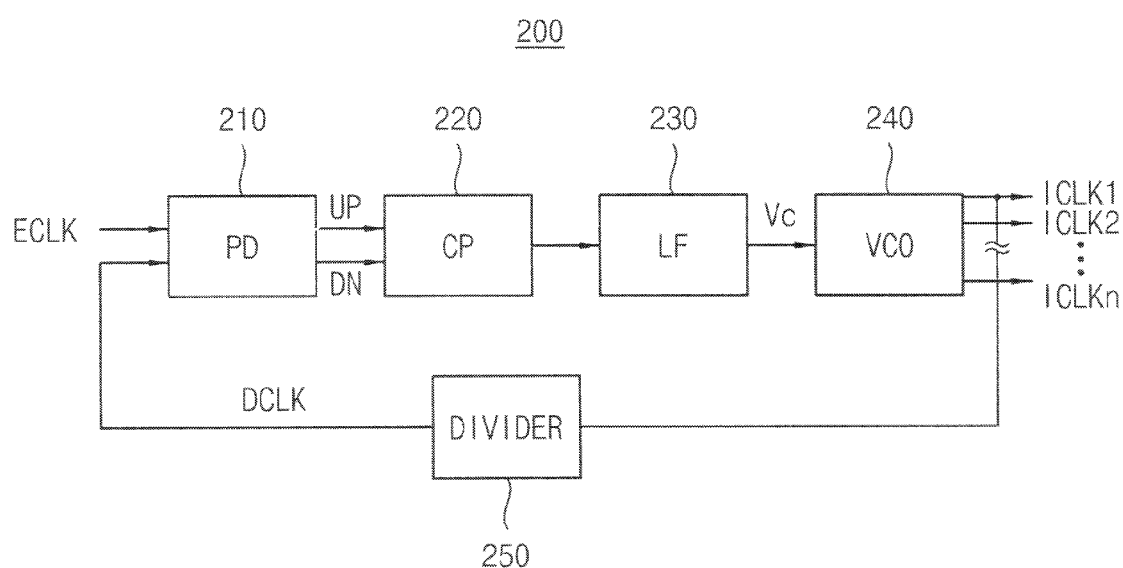
FIG. 7 is a block diagram illustrating a phase-locked loop according to an embodiment of the inventive concept.

FIG. 7 is a block diagram of a phase-locked loop (PLL) according to an embodiment of the inventive concept. Referring to FIG. 7, a PLL 200 comprises a phase difference detector 210, a charge pump 220, a loop filter 230 and a VCO 240. The PLL 200 may further comprise a divider 250.

The phase difference detector 210 generates an up signal (UP) and a down signal (DN) by detecting a phase difference between an input clock signal ECLK and a divided clock signal DCLK. The phase difference detector 210 may generate the up signal when a phase of the input clock signal ECLK leads a phase of the divided clock signal DCLK, and generate the down signal when the phase of the divided clock signal DCLK leads the phase of the input clock signal ECLK. The charge pump 220 and the loop filter 230 may increase a voltage level of the control voltage Vc in response to the up signal, and decrease the voltage level of the control voltage Vc in response to the down signal. The VCO 240 may generate N, where N is an integer, internal clock signals ICLK1 to ICLKn in response to the control voltage Vc. The internal clock signals ICLK1 to ICLKn may have a different phase from each other, the same phase difference with each other and a CMOS full voltage swing level. The divider 250 generates the divided clock signal DCLK by dividing one of the N internal clock signals ICLK1 to ICLKn. The VCO 100 of FIG. 1A may be used for the VCO 240 of FIG. 7.

Figure 8:
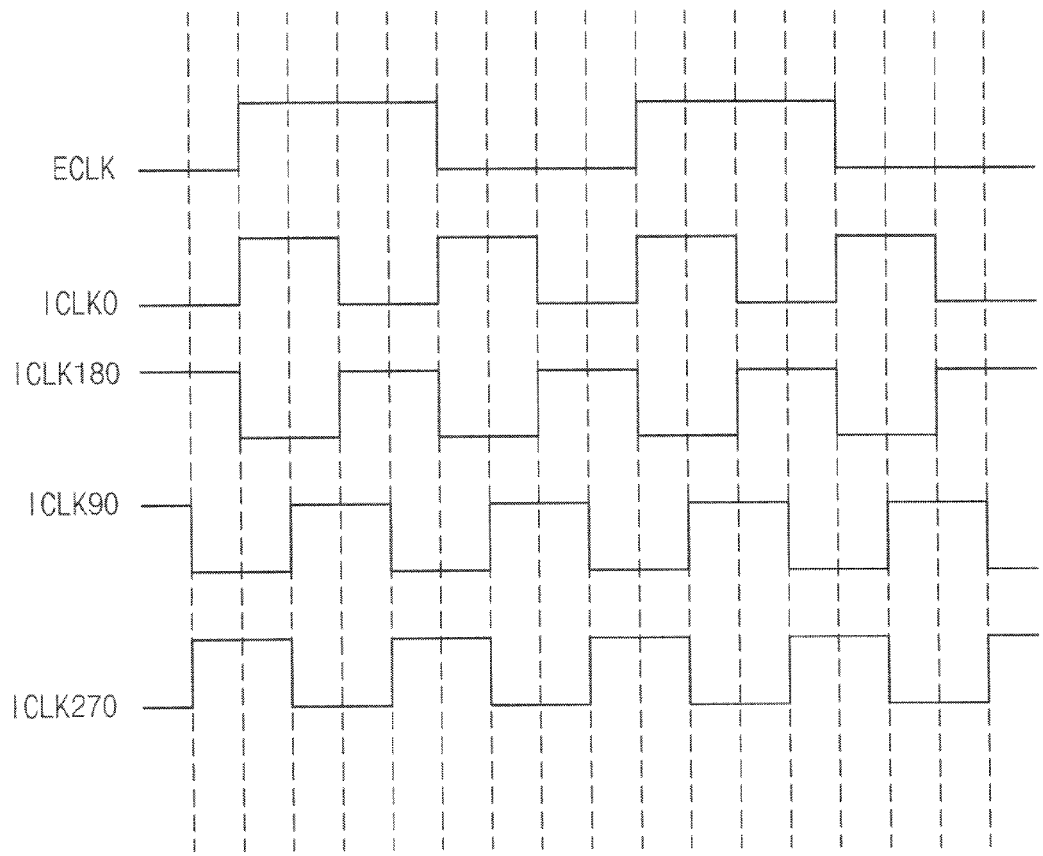
FIG. 8 is a timing diagram further describing the operation of the phase-locked loop of FIG. 7, wherein the voltage-controlled oscillator of FIG. 1A is used for a voltage-controlled oscillator of FIG. 7.

FIG. 8 is a timing diagram further describing the operation of the PLL of FIG. 7 when the VCO of FIG. 1A is used for the VCO of FIG. 7. The internal clock signals ICLK1 to ICLKn of FIG. 8 may be the corrected clock signals DoI, DoQ, DoIb and DoQb of FIG. 1A. FIG. 8 is a timing diagram when the internal clock signal ICLK0 is synchronized with the input clock signal ECLK.

When the input clock signal ECLK has a frequency of 1 GHz, as illustrated in FIG. 8, the VCO 240 of FIG. 8 may generate four clock signals ICLK0 to ICLK 270, which have a frequency two times greater than the frequency of the input clock signal ECLK, that is 2 GHz, a phase difference of 90°, and a CMOS full voltage swing level, in order to generate the internal clock signals ICLK0 to ICLK270 having a frequency of 2 GHz. Therefore, the PLL according to example embodiments may generate the four clock signals ICLK0 to ICLK 270, each of which has a frequency of 2 GHz and a different phase from each other, at a relatively low power supply voltage by using the VCO 100 of FIG. 1A and FIG. 2, instead of using a separate divider, so that the PLL may reduce a power consumption and may not need a separate level converter.

In certain embodiments of the inventive concept, a VCO may include differential amplifiers instead of inverters used above.

Figure 9A:
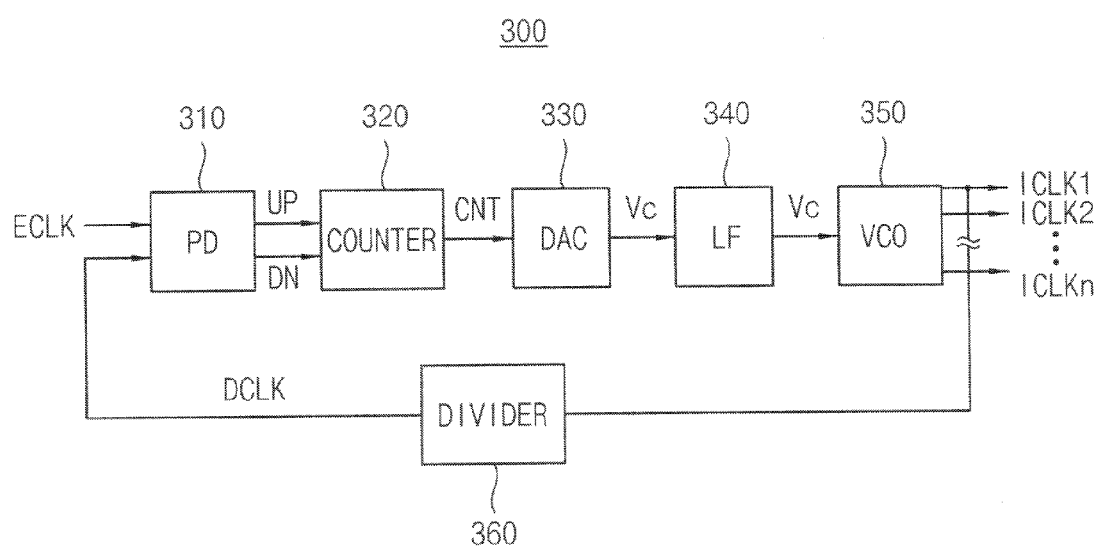
FIG. 9A is a block diagram illustrating a phase-locked loop according to another embodiment of the inventive concept.

FIG. 9A is a block diagram illustrating a PLL according to another embodiment of the inventive concept. Referring to FIG. 9A, a PLL 300 comprises a phase difference detector PD 310, a counter 320, a digital-analog converter (DAC) 330, a loop filter LF 340, a VCO 350 and a divider 360.

The phase difference detector 310 generates an up signal (UP) and a down signal (DN) by detecting a phase difference between an input clock signal ECLK and a divided clock signal DCLK. The phase difference detector 310 may generate the up signal when a phase of the input clock signal ECLK leads a phase of the divided clock signal DCLK, and generate the down signal when the phase of the divided clock signal DCLK leads the phase of the input clock signal ECLK. The counter 320 may generate bits of a digital counting output signal CNT by counting up in response to the up signal and counting down in response to the down signal. The DAC 330 and the loop filter 340 may generate a control voltage Vc by converting the digital counting output signal CNT into an analog signal. The VCO 350 may generate N, where N is an integer, internal clock signals ICLK1 to ICLKn in response to the control voltage Vc. The internal clock signals ICLK1 to ICLKn may have a different phase from each other, a same phase difference with each other and a CMOS full voltage swing level. The divider 360 may generate the divided clock signal DCLK by dividing one of the n internal clock signals ICLK1 to ICLKn. The VCO 100 of FIG. 1A may be used for the VCO 350 of FIG. 9A. The PLL 200 of FIG. 7 may be an analog PLL and the PLL 300 of FIG. 9A may be a digital PLL.

Figure 9B:
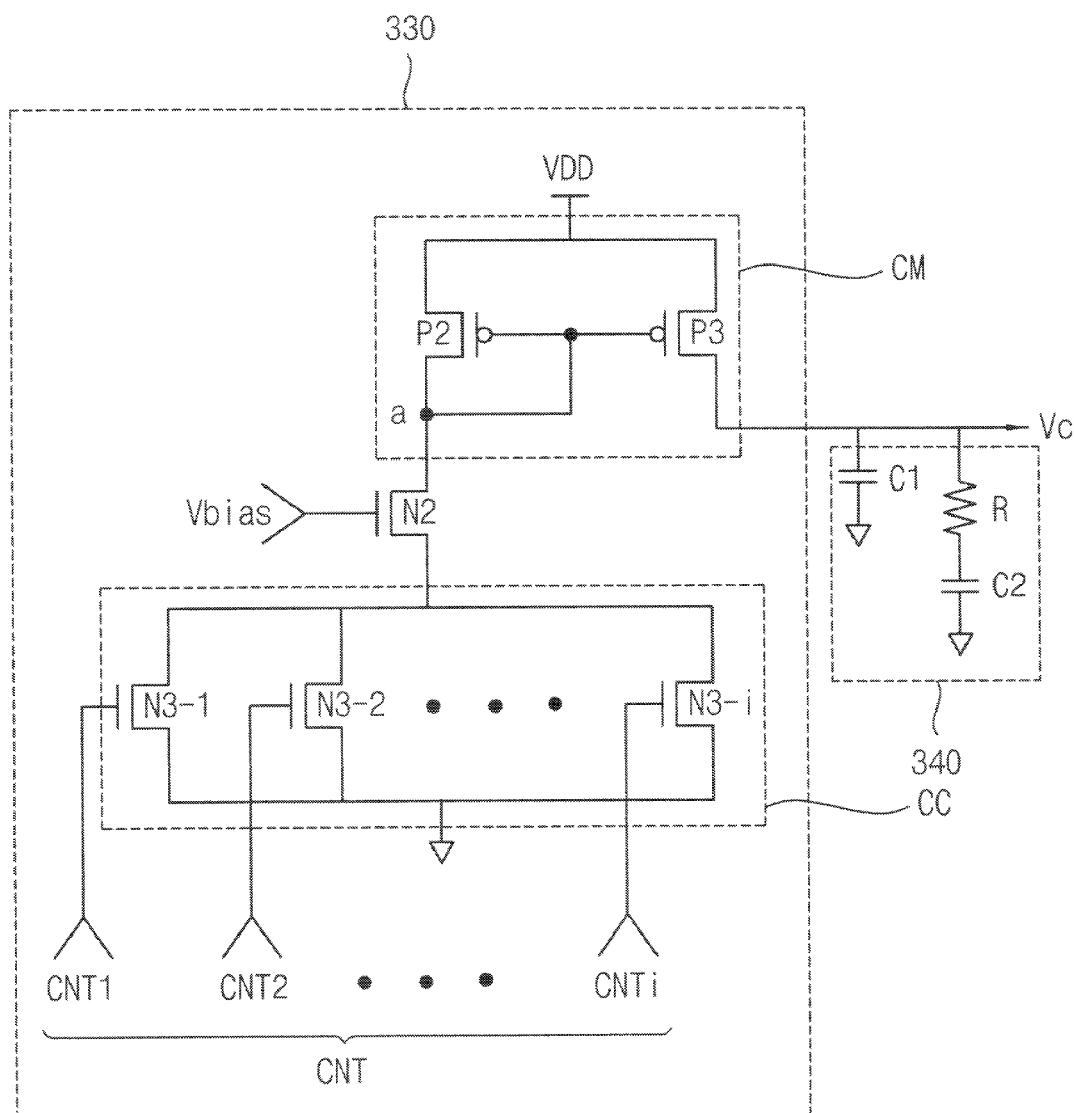
FIG. 9B is a circuit diagram further illustrating the digital-analog converter and a loop filter of FIG. 9A.

FIG. 9B is a circuit diagram further illustrating the DAC and loop filter of FIG. 9A. The DAC 330 may include a current mirror CM having PMOS transistors P2 and P3, a current controller CC having NMOS transistors N3-1 to N3-$i$ ($i$ is an integer), and an NMOS transistor N2. The loop filter 340 may include capacitors C1 and C2, and a register R. In FIG. 9B, Vbias represents a bias voltage and CNT1 to CNTi represent i bits of the digital counting output signal CNT.

Hereinafter, an exemplary mode of operation for the circuit of FIG. 9B will be described.

When the bias voltage Vbias, having a predefined voltage level, and the digital counting output voltage CNT, having high voltage level for all the i bits, are applied, all of the NMOS transistors N3-1 to N3-i may turn on so that a maximum current may flow through the NMOS transistors N3-1 to N3-i. Therefore, a voltage level apparent at node "a" may be a minimum so that a voltage level of the control voltage Vc may be a maximum. On the other hand, when the digital counting output voltage CNT having low voltage level for all the i bits are applied, all of the NMOS transistors N3-1 to N3-i may turn off. Therefore, the voltage level of the node a may be a maximum so that the voltage level of the control voltage Vc may be a minimum. As described above, the voltage level of the control voltage Vc may be varied by controlling the current flowing through the NMOS transistors N3-1 to N3-i in response to the i bits of the digital counting output voltage CNT. The control voltage Vc may be filtered by the loop filter 340.

The digital PLL of FIG. 9A, as well as the PLL of FIG. 7, may generate the n internal clock signals ICLK1 to ICLKn having a full voltage swing level at a relatively low operating voltage without using a divider or using relatively small number of dividers.

Figure 10:
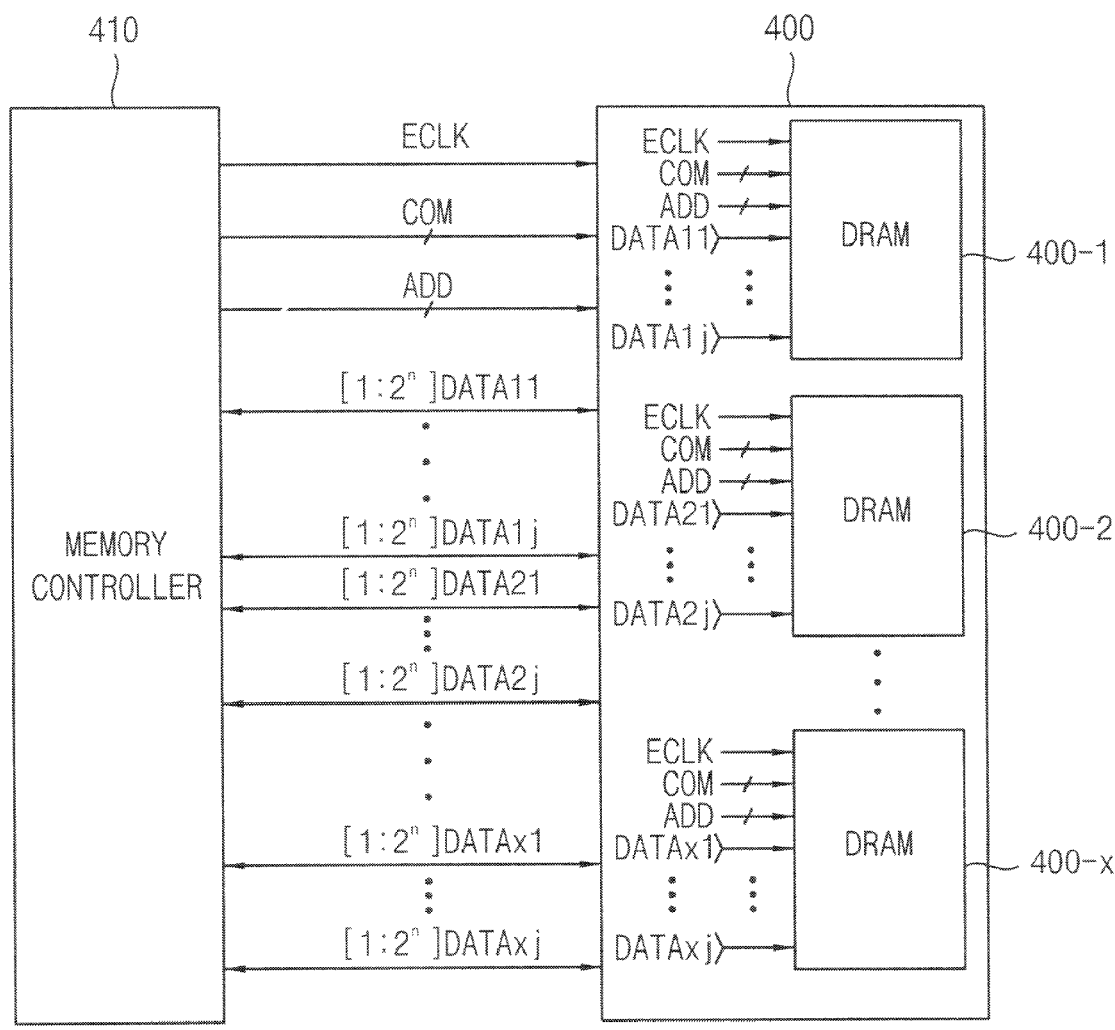
FIG. 10 is a block diagram illustrating a memory system according to an embodiment of the inventive concept.
Figure 11:
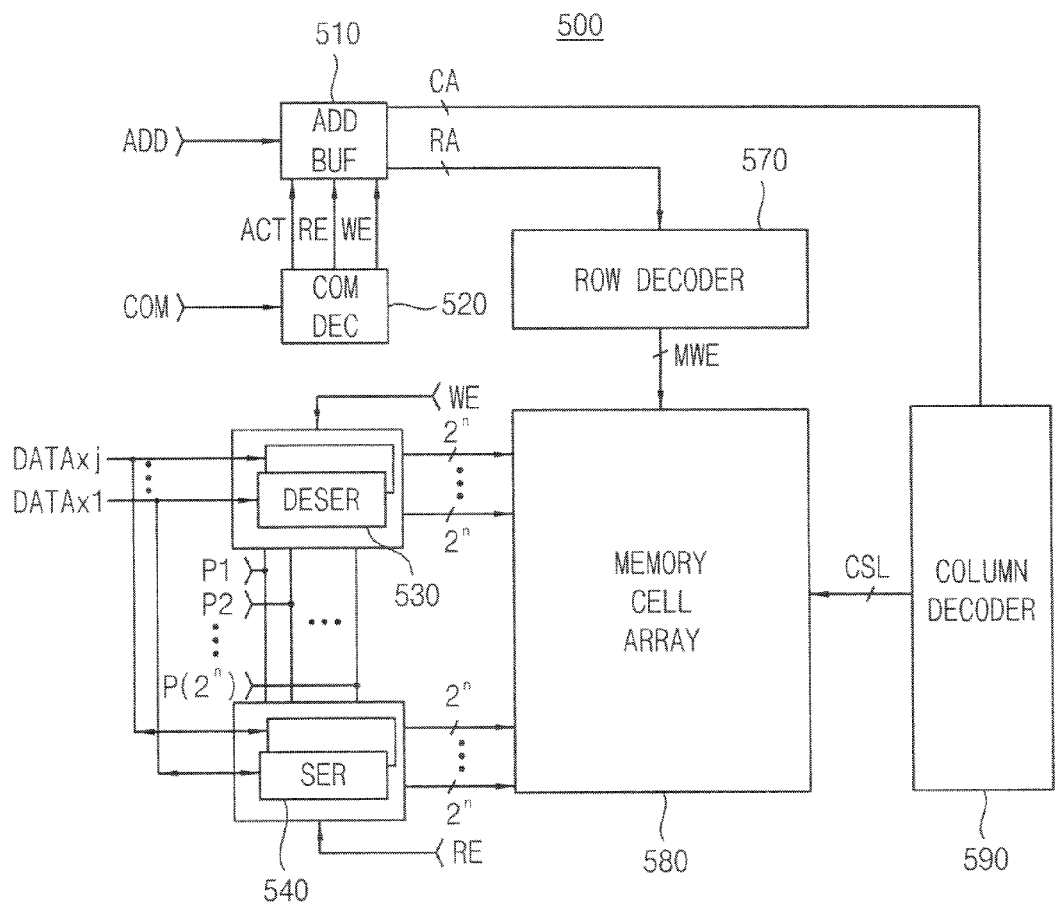
FIG. 11 is a block diagram further illustrating a memory device within the memory system of FIG. 10.
Figure 11:
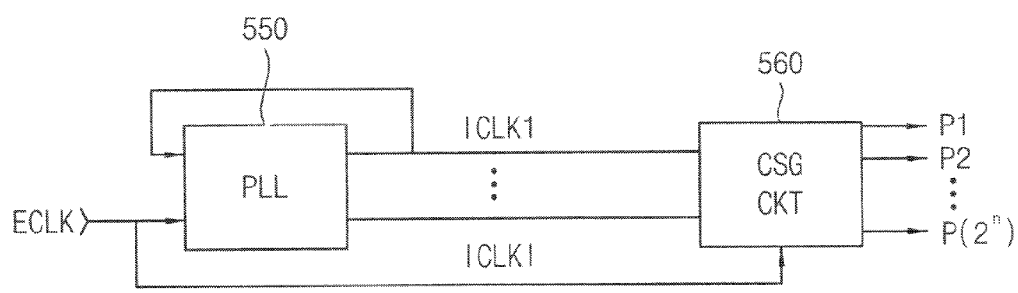

FIG. 10 is a block diagram illustrating a memory system according to an embodiment of the inventive concept, and FIG. 11 is a block diagram further illustrating a memory device within the memory system of FIG. 10. The memory system of FIG. 10 and the memory device of FIG. 11 may include at least one PLL of FIG. 7 or FIG. 9A.

Referring to FIG. 10, the memory system may include a memory controller 410 and a memory module 400. The memory module 400 may include a plurality of memory devices 400-1 to 400-x, where "x" is an integer. The plurality of memory devices 400-1 to 400-x may include a dynamic random access memory (DRAM).

The memory controller 410 may provide the memory module 400 with a external clock signal ECLK, at least one command signal COM, at least one address signal ADD and/or at least one data signal DATA.

The memory module 400 may provide the memory controller 410 with at least one data signal DATA. In example embodiments of FIG. 10, each of the at least one data signal DATA may include a serial data including $2^n$ bits.

The serial data including $2^n$ bits may be represented by [1:$2^n$]DATA11 to [1:$2^n$]DATAxj, where "j" is an integer. As illustrated in FIG. 10, the memory device 400-1 may receive the external clock signal ECLK, the at least one command signal COM, the at least one address signal ADD and the data signals DATA11 to DATA1j. Similarly, the memory device 400-2 may receive the external clock signal ECLK, the at least one command signal COM, the at least one address signal ADD and the data signals DATA21 to DATA2j, and the memory device 400-x may receive the external clock signal ECLK, the at least one command signal COM, the at least one address signal ADD and the data signals DATAx1 to DATAxj.

As illustrated in FIG. 10, each of the memory devices 400-1 to 400-x may generate or receive the serial data DATA including $2^n$ bits during one cycle of the external clock signal ECLK.

Referring to FIG. 11, the memory device 500 may include an address buffer ADD BUF 510, a command decoder COM DEC 520, at least one deserializer DESER 530, at least one serializer SER 540, a memory cell array 580, a row decoder 570, a column decoder 580, a PLL 550 and a control signal generation circuit CSG CKT 560. The address buffer 510 may receive the at least one address signal ADD, and provide the row decoder 570 with a row address RA in response to an active command signal ACT.

The row decoder 570 may activate a main word line enable signal MWE, corresponding to a plurality of row addresses generated from a plurality of row address buffers, so that a desired word line (not illustrated) in the memory cell array 580 may be selected. The address buffer 510 may provide the column decoder 590 with a column address CA in response to a read command RE or a write command WE decoded from the at least one command signal COM.

The column decoder 590 may activate a column selection line CSL corresponding to a plurality of column addresses received from the address buffer 510. A plurality of bit lines (not illustrated) in the memory cell array 580 may be selected in response to the activated column selection line so that a plurality of data may be written into the selected memory cells or read from the selected memory cells.

As described above, the command decoder 520 may generate the active command ACT, the read command RE and the write command WE in response to the at least one command signal COM.

The deserializer 530 may receive the serial data DATA including $2^n$ bits, and provide the memory cell array 580 with a parallel data including $2^n$ bits, simultaneously, through $2^n$ data bus lines in response to the write command WE and a plurality of control signals P1 to P($2^n$). The number of the deserializer 530 may be j when the number of a data input/output pin DQ is j. Each of the deserializer 530 may be connected to the memory cell array 580 through the $2^n$ data bus lines.

The serializer 540 may receive the parallel data including $2^n$ bits from the memory cell array 580, and generate a serial data including $2^n$ bits in response to the read command RE and the plurality of control signals P1 to P($2^n$). The number of the serializer 540 may be j when the number of the data input/output pin DQ is j.

The PLL 550 may receive the external clock signal ECLK and generate an internal clock signal ICLK1 synchronized with the external clock signal ECLK by performing a locking operation. When the locking operation is finished, the PLL 550 may provide the control signal generation circuit 560 with a plurality of internal clock signals ICLK1 to ICLKI. The control signal generation circuit 560 may generate the plurality of control signals P1 to P($2^n$) based on the plurality of internal clock signals ICLK1 to ICLKI. The plurality of internal clock signals ICLK1 to ICLKI generated from the PLL 550 may be provided to the deserializer 530 and the serializer 540 as control signals.

As described above, a VCO, a PLL incorporating the VCO, and/or a memory device incorporating the PLL according to various embodiments of the inventive concept reduce the current consumption and size of circuits generating clock signals having a defined phase relationship, but also having a CMOS full voltage swing level at a relatively low voltage. Therefore, embodiments of the inventive concept may be used in a memory device, a memory system and various fields needing clock signals having (e.g.) a same phase difference with each other in order to expand data bandwidth.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A voltage-controlled oscillator (VCO), comprising:
   a first oscillation unit configured to generate a plurality of respective intermediate clock signals at a plurality of first respective nodes to which a plurality of first ring-shaped circuits are multiply connected in response to a control voltage, wherein each one of the plurality of intermediate clock signals has a different phase, a defined relative phase difference with other ones of the plurality of intermediate clock signals, and swings between a first voltage level and a second voltage level; and
   a second oscillation unit configured to convert voltage levels of the plurality of intermediate clock signals to generate a plurality of respective output clock signals at a plurality of second respective nodes to which a plurality of second ring-shaped circuits are multiply connected, the plurality of second ring-shaped circuits passing the plurality of first nodes, and the plurality of output clock signals swinging between a third voltage level and a fourth voltage level.

2. The VCO of claim 1, wherein each one of the plurality of first ring shape circuits comprises at least two first inversion circuits, and each one of the plurality of second ring shape circuits comprises at least two second inversion circuits.

3. The VCO of claim 2, wherein each one of the at least two first inversion circuits comprises an inverter coupled between a power supply voltage and the control voltage, and each one of the at least two second inversion circuits comprises an inverter coupled between the power supply voltage and a ground voltage.

4. The VCO of claim 2, wherein the first oscillation unit respectively generates each one of the plurality of intermediate clock signals at a corresponding one of the plurality of first nodes by performing a phase interpolation on clock signals provided from the plurality of first ring shape circuits sharing each of the plurality of first nodes.

5. The VCO of claim 1, further comprising:
   a plurality of output buffers configured to generate corrected clock signals by correcting a duty cycle ratio for each one of the plurality of output clock signals.

6. The VCO of claim 1, wherein a voltage swing range for the plurality of output clock signals is greater than a voltage swing range for the plurality of intermediate clock signals, and the voltage swing range of the plurality of output clock signals is a full voltage swing range for a complementary metal-oxide-semiconductor (CMOS) level.

7. A phase-locked loop (PLL), comprising:
  a phase difference detector configured to generate an up signal and a down signal based on a phase difference between an input clock signal and a feedback clock signal;
  a charge pump configured to increase a control voltage in response to the up signal, and to decrease the control voltage in response to the down signal; and
  a voltage-controlled oscillator (VCO) configured to generate a plurality of internal clock signals in response to the control voltage, wherein each one of the plurality of internal clock signals has a different phase, a defined relative phase difference with other ones of the plurality of internal clock signals, and a full voltage swing between a first voltage level and a second voltage level.

8. The PLL of claim 7, wherein the VCO comprises multiply-connected ring-shaped circuits, and respective frequencies for the plurality of internal clock signals are N, where N is an integer, times greater than a frequency of the input clock signal.

9. The PLL of claim 7, further comprising:
  a divider configured to generate the feedback clock signal by dividing a frequency of at least one of the plurality of internal clock signals.

10. A memory device, comprising:
  a memory cell array;
  a phase-locked loop (PLL) configured to generate a plurality of internal clock signals in response to an input clock signal and a feedback clock signal, wherein each one of the plurality of internal clock signals has a different phase, a defined relative phase difference with other ones of the plurality of internal clock signals, and a full voltage swing between a first voltage level and a second voltage level;
  a control signal generator configured to generate a plurality of control signals based on the plurality of internal clock signals;
  at least one deserializer configured to convert a serial bit stream into a parallel bit stream in response to each of the plurality of control signals, the parallel bit stream being written into the memory cell array; and
  at least one serializer configured to convert a parallel bit stream received from the memory cell array into a serial bit stream in response to each of the plurality of control signals.

* * * * *